United States Patent [19]
Xie

[11] Patent Number: 5,841,385
[45] Date of Patent: Nov. 24, 1998

[54] SYSTEM AND METHOD FOR PERFORMING COMBINED DIGITAL/ANALOG AUTOMATIC GAIN CONTROL FOR IMPROVED CLIPPING SUPPRESSION

[75] Inventor: Zheng-Yi Xie, Richardson, Tex.

[73] Assignee: Advanced Micro Devices, Inc., Sunnyvale, Calif.

[21] Appl. No.: 712,773

[22] Filed: Sep. 12, 1996

[51] Int. Cl.$^6$ .................................................. H03M 1/18
[52] U.S. Cl. ............................................................ 341/139
[58] Field of Search ............................................. 341/139

[56] References Cited

U.S. PATENT DOCUMENTS

| | | | |
|---|---|---|---|
| 4,611,342 | 9/1986 | Miller et al. | 381/36 |
| 5,016,205 | 5/1991 | Shumway . | |
| 5,630,221 | 5/1997 | Birleson | 455/249.1 |
| 5,631,969 | 5/1997 | Hanson | 381/107 |

FOREIGN PATENT DOCUMENTS

| | | | |
|---|---|---|---|
| 0163721 | 7/1986 | Japan | 341/139 |
| 0114333 | 5/1987 | Japan | 341/139 |
| 403036808 | 2/1991 | Japan | 341/139 |
| 094028632 | 12/1994 | WIPO | 341/139 |

OTHER PUBLICATIONS

D. Morgan, A/D Conversion Using Geometric Feedback AGC, IEEE Transactions on Computers, vol. C–24, No. 11, Nov. 1975.
*McGraw–Hill Encyclopedia of Science & Technology*, 1982 by McGraw–Hill, Inc., pp. 881–882.

*Primary Examiner*—Brian K. Young
*Attorney, Agent, or Firm*—Conley, Rose & Tayon; Jeffrey C. Hood; E. Alan Davis

[57] ABSTRACT

A system which performs automatic gain control on received audio data. The system comprises an analog adjustable gain amplifier coupled to a digital gain control loop which is preferably a digital signal processor, with an A/D converter and D/A converter interposed between the amplifier and control loop. The invention thus advantageously amplifies the analog input signal before being converted into a digital signal. This results in better performance than prior art system which amplify an already converted to digital signal which may have already been clipped before the signal could be attenuated. The combined digital/analog method provides improved detection of silence to avoid amplifying background noise. The gain control loop comprises a long-term energy averager and gain calculator as well as a short-term energy averager and gain calculator which receive the digital audio output signal. The gain calculators periodically generate gain adjustment outputs based on the average energy of the audio signal so as to attenuate or amplify the analog audio input signal. Thus the invention advantageously achieves the apparently conflicting objectives of having an automatic gain control system which is both stable and responds quickly to clipping. The gain control loop further comprises a voice activity detector which detects the presence of silence versus voice activity based on ratios of the long-term and short-term energy averages. The long-term energy averager advantageously pauses operation during silence. Additionally, the gain control system amplifies the audio input signal only during the voice activity thus suppressing noise amplification during periods of silence.

19 Claims, 2 Drawing Sheets

SYSTEM AND METHOD FOR PERFORMING COMBINED DIGITAL/ANALOG AUTOMATIC GAIN CONTROL FOR IMPROVED CLIPPING SUPPRESSION

BACKGROUND OF THE INVENTION

1. Field of the Invention

The present invention relates to the field of audio range signal transceivers and, more particularly, to a combined analog/digital automatic gain control circuit in a telephone signal transceiver which includes noise control, clipping suppression and gain scheduling.

2. Description of the Relevant Art

Many electrical devices, such as an answering machine, receive an input signal wherein the input signal gain or strength can vary widely and rapidly. In such cases it is often desirable to maintain the gain of the input signal within an acceptable range in the presence of relatively large fluctuations in input signal level. This is particularly desirable if the input signal is provided to another device requiring a certain range of input signal level. Automatic gain control (AGC) circuits are commonly included in such electrical devices to maintain the gain of the input signal at a relatively constant value or within a desired dynamic range. AGC circuits operate by adjusting the amplification of the input signal in inverse proportion to the input signal strength.

A common application of AGC circuits is in telephone devices or signal transceivers, including digital cordless telephone base stations and digital telephone answering machines. In digital telephone transceivers an analog input signal, such as speech, music or dual-tone multifrequency (DTMF) signals, is converted to a digital signal by an analog-to-digital converter. A digital signal processor or other digital circuitry in the telephone device then performs operations on the digital signal. For example, the telephone answering device typically includes a vocoder which performs voice coding on the digital signal and stores the coded data. It is crucial that the input digital signal be maintained within a dynamic range which is acceptable for the telephone device. Otherwise, a loss of information occurs due to distortion (including clipping) or low signal to noise ratio (SNR). Hence, a telephone device typically employs an AGC circuit to maintain the signal within the desired dynamic range.

One important aspect of AGC circuits is their stability. The AGC circuit is required to adjust the amplification of the input signal in inverse proportion to the gain of the input signal while maintaining stability of the circuit. If the AGC adjusts the gain too frequently or in too large amounts, the gain control loop may become unstable. Hence, in designing an AGC circuit it is necessary to examine and analyze the input signal strength and to adjust the amplification relatively infrequently and in small amounts. This can be achieved by using a closed-loop feedback control system in which all the poles of the loop transfer function reside in the unit circle.

When analog-to-digital converters convert an analog input signal to a digital output signal, a phenomenon known as "clipping" may occur. Signal clipping occurs when the input signal exceeds the maximum input level of the analog-to-digital converter. Hence, the amplitude of the input signal above the analog-to-digital converter upper threshold is "clipped". This results in distortion, or unfaithful reproduction, of the input signal. As a greater amount of the amplitude of the input signal is clipped, and the longer clipping is allowed to occur, more distortion is introduced into the output signal. Hence, the possibility of clipping produces a motivation to design an AGC circuit which responds relatively quickly to adjust the gain of the input signal. This motivation is apparently in conflict with the goal of designing a stable AGC.

When the input signal strength is relatively low, the AGC circuit will amplify the signal accordingly. However, if the signal is amplified above the maximum input level of the analog-to-digital converter, then clipping may occur. To eliminate this problem, AGC circuits sometimes include circuitry to detect zero crossings of the input signal, i.e., the signal waveform changing from a positive to negative value or vice versa. The AGC then amplifies the input signal near a zero crossing to reduce the distortion and the possibility of clipping. However, an improved system and solution is sought.

Digital telephone devices comprising a DSP generally have the DSP perform the amplification. This solution is problematic in that the digital signal processor is operating on a digital signal, i.e., one which has already potentially been clipped. Hence, a lower distortion solution is desired.

Another problem associated with AGC circuits in telephone devices is the amplification of noise during periods of silence. During periods of silence, the input signal strength is very small. Under standard operation the AGC circuit detects that the signal strength has gone below an acceptable range, and the circuit increases the gain substantially to attempt to get the signal back into the desired range. As a result, noise present during the silent period, most notably the noise introduced by the telephone device, is also amplified. It may be annoying for a user to hear amplified noise during silent periods. A common example is the hiss often heard on older vintage speaker-phones during periods of silence; a system and method is desired which provides improved automatic gain control.

SUMMARY OF THE INVENTION

The present invention comprises a system which performs automatic gain control on received audio data. The system comprises an analog amplifier with an adjustable gain which receives an analog audio input signal and generates an analog audio output signal. The analog amplifier also receives an analog gain input, wherein the amplifier selectively adjusts the gain of the analog audio output signal according to the analog gain input. A codec receives the analog audio output signal and converts the analog audio output signal to a digital audio output signal. The output of an digital-to-analog converter is coupled to the analog gain input of the amplifier.

A gain control loop receives the digital audio output signal. The gain control loop provides a digital gain output signal to the digital-to-analog converter input. Preferably the gain control loop comprises a digital signal processor. The invention thus advantageously amplifies the analog input signal before being converted into a digital signal. This results in better performance than prior art system which amplify an already converted to digital signal which may have already been clipped before the signal could be attenuated.

The gain control loop comprises a long-term energy averager which receives the digital audio output signal and calculates a long-term energy average of the digital audio output signal based on a first number of samples of the digital audio output signal. The long-term energy averager generates a long-term energy average output in response to the calculated long-term energy average. A long-term gain adjustment calculator receives the long-term energy average output and periodically generates a long-term gain adjustment signal. The long-term gain adjustment calculator generates the long-term gain adjustment signal to attenuate the analog audio input signal when the long-term energy average output is greater than an upper threshold. The long-term gain adjustment calculator generates the long-term gain adjustment signal to amplify the analog audio input signal when the long-term energy average output is less than a lower threshold.

The gain control loop further comprises a short-term energy averager which receives the digital audio output signal and calculates a short-term energy average of the audio output signal based on a second number of samples of the digital audio output signal. The short-term energy averager generates a short-term energy average output in response to the calculated short-term energy average. A short-term gain adjustment calculator receives the short-term energy average output and periodically generates a short-term gain adjustment signal. The short-term gain adjustment calculator generates the short-term gain adjustment signal to attenuate the audio input signal when the short-term energy average output is greater than an upper threshold.

The gain control loop selectively generates the digital gain output signal based upon the long-term gain adjustment signal and the short-term gain adjustment signal. Thus by employing a long-term energy averager and gain calculator in combination with a short-term energy averager and gain calculator, the invention advantageously achieves the apparently conflicting objectives of having an automatic gain control system which is both stable and responds quickly to clipping.

The gain control loop further comprises a voice activity detector which receives the long-term energy average output and the short-term energy average output. The voice activity detector generates a silence present output when the voice activity detector detects a substantial absence of voice activity. The absence of voice activity is based upon the ratio of the short-term energy average output and the long-term energy average output being less than a threshold. The long-term energy averager receives the silence present output and pauses operation when the silence present output indicates the substantial absence of voice activity. Thus the long-term energy averager more accurately estimates the average energy of the output signal, which advantageously makes the system more stable and enables the voice activity detector to more accurately distinguish between noise and voice activity.

The voice activity detector also generates a voice activity output when the voice activity detector detects substantial voice activity. The voice activity is based upon the ratio of the short-term energy average output and the long-term energy average output being greater than a threshold. The automatic gain control system amplifies the analog audio input signal only during the substantial voice activity. The voice activity detector thus enables the system to suppress noise amplification during periods of silence.

The amplifier has an associated gain range. The gain control loop further comprises a gain limiter which receives a selected one of the long-term gain adjustment signal and the short-term gain adjustment signal and generates the digital gain output signal within the gain range.

BRIEF DESCRIPTION OF THE DRAWINGS

A better understanding of the present invention can be obtained when the following detailed description of the preferred embodiment is considered in conjunction with the following drawings, in which.

Figure 1:
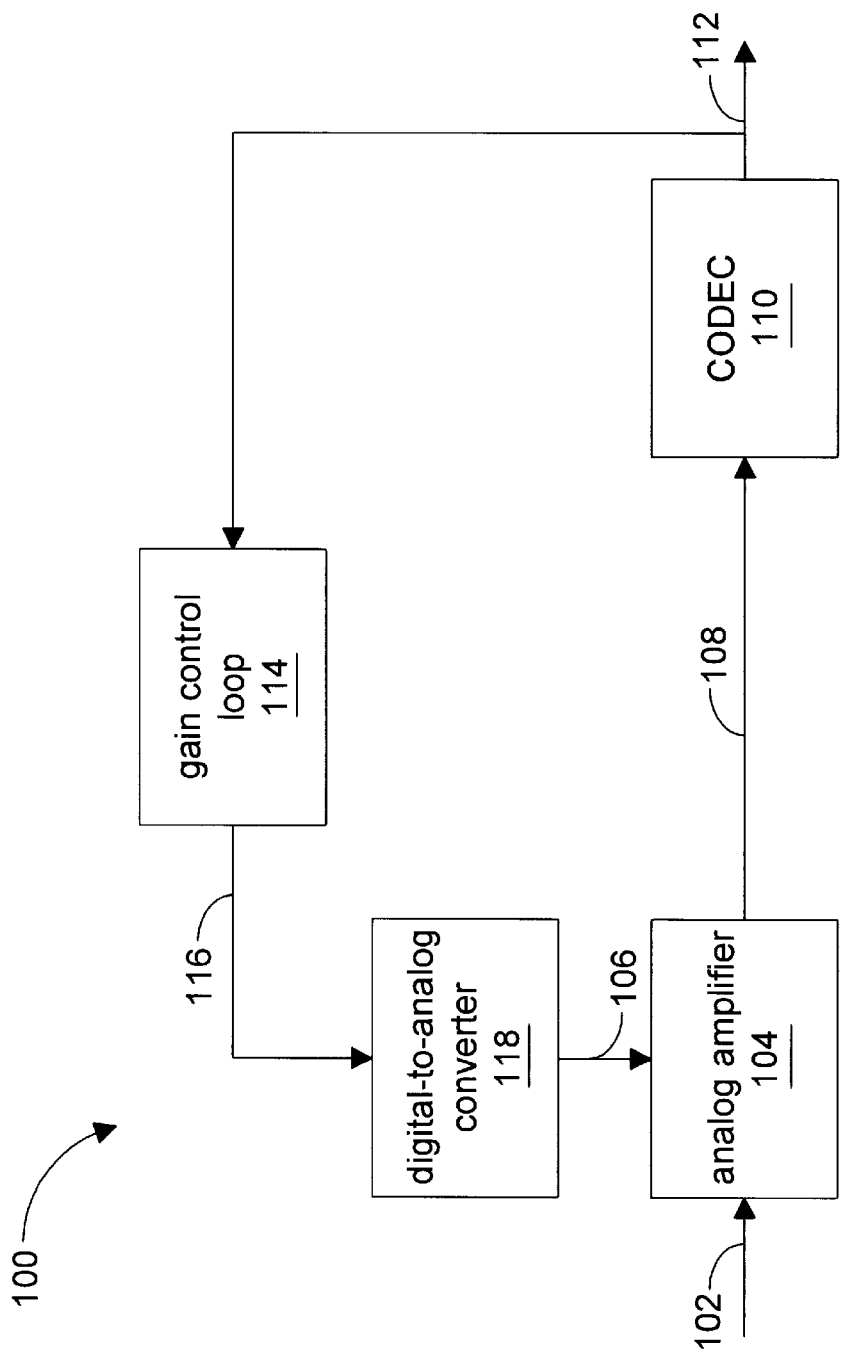
FIG. 1 is a block diagram of a system 100 for performing automatic gain control on an audio input signal according to the preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Referring now to FIG. 1, a block diagram of a system for performing automatic gain control on an analog input signal 102 in the audio frequency range according to the preferred embodiment of the present invention is shown. An analog amplifier 104 receives the audio input signal 102. The amplifier 104 has an adjustable gain which is controlled by an analog gain adjustment input 106. The amplifier 104 amplifies or attenuates the input signal 102 and produces a corresponding amplified analog audio output signal 108. A CODEC (coder/decoder) 110 receives the output signal 108 and converts the analog output signal 108 into a digital audio output signal 112. An application circuit (not shown), such as a digital telephone answering machine, preferably receives the digital output signal 112 and processes the digital output signal 112 to perform a desired function.

A gain control loop 114 receives the digital output signal 112. The control loop 114 analyzes the digital output signal 112 and generates a digital gain output 116 to adjust the gain of the amplifier 104. The control loop 114 is preferably a digital signal processor programmed to perform the device functions. The control loop may also be comprised of a programmed general purpose CPU or dedicated digital or analog circuitry.

An digital-to-analog (D/A) converter 118 receives the digital gain output 116 and converts the digital gain output 116 and converts the digital gain output 116 into the analog gain input 106 to adjust the gain of the amplifier 104. The control loop 114 selectively increases the gain, decreases the gain or does not change the gain of the amplifier 104 according to the analysis of the digital output signal 112.

The preferred embodiment of the present invention advantageously combines an analog amplifier 104 and a digital gain control loop 114. By amplifying the analog input signal 102 in an analog manner the present invention advantageously minimizes clipping. That is, the analog input signal 102 is amplified, i.e., the gain is adjusted, before being converted into a digital signal by the CODEC 110. Thus if the input analog signal 102 has exceeded the dynamic range of the CODEC 110, then adjusting the gain prior to A/D conversion results in a reduced amount of the input signal (and possibly none of it) being clipped. This results in better performance than if the input signal was directly converted to a digital signal before the signal could be amplified or attenuated. This is an improvement over prior art digital gain control loops which amplify or attenuate a digital version of the input signal. The present invention also provides improved accuracy and noise control over analog solutions, as well as a reduction in overall system cost due to the reduction of the number analog components.

Figure 2:
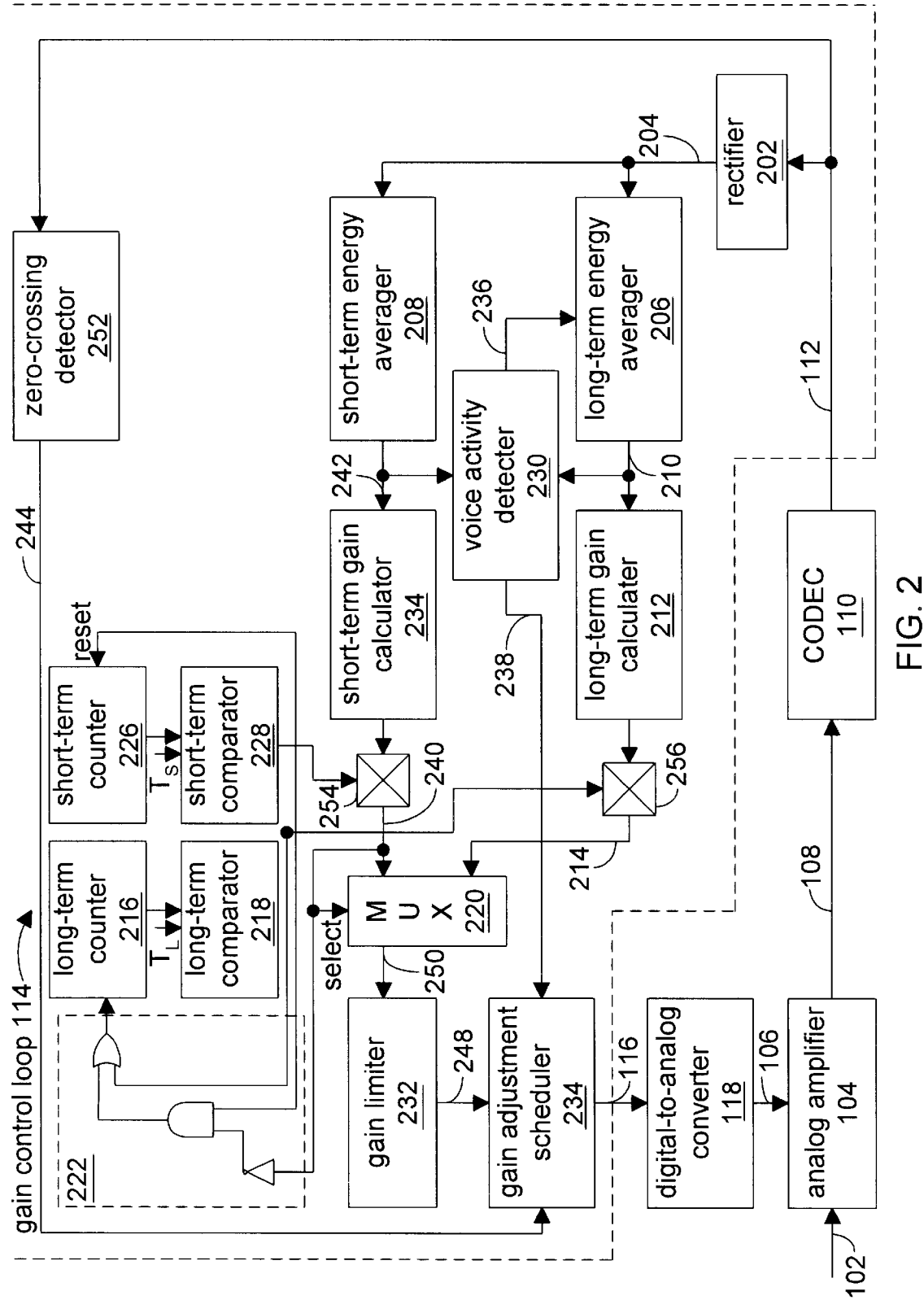
FIG. 2 is a block diagram illustrating more detailed portions of the automatic gain control system shown in FIG. 1.

Turning now to FIG. 2, a block diagram illustrating more detailed portions of the automatic gain control system 100 of FIG. 1, particularly the gain control loop 114, is shown. Elements in FIG. 2 which are similar or identical to elements in FIG. 1 have the same reference numerals for simplicity and clarity. Preferably gain control loop 114 includes a rectifier 202 which receives the digital audio output signal 112 and generates a rectified digital audio output signal 204. Gain control loop 114 also includes a long-term energy averager 206 and a short-term energy averager 208 which each receive the rectified output signal 204. By receiving a rectified version of the output signal, the energy averagers advantageously calculate energy averages with a better dynamic range than implementations which calculate energy averages by squaring the value of the signal.

The long-term energy averager 206 is preferably a normalized auto-regressive filter with a relatively long time constant. The long-term energy averager 206 estimates an average of the energy of the rectified digital output signal 204 over a relatively large number of samples, corresponding to the time constant of the filter, and generates a long-term energy average output 210. By calculating an average of the energy of the output signal 204 over a relatively large number of samples, the long-term energy averager 206 advantageously enables the gain control loop 114 to maintain the stability of the gain control system 100. Alternatively, the long-term energy averager 206 is an auto-regressive filter which calculates the long term energy average using the previous long-term energy average and a few of the most recent samples.

The long-term energy average output 210 is received by a long-term gain calculator 212. The long-term gain calculator 212 periodically generates a long-term gain adjustment signal 214 according to a long-term gain adjustment period, $T_L$. The time constant of the long-term energy averager 206 is preferably approximately equivalent to the long-term gain adjustment period $T_L$. In the preferred embodiment $T_L$ is approximately 400 samples, where the preferred sample rate is 8 kHz. A long-term counter 216 counts up from zero upon being reset. A long-term comparator 218 receives the output of the long-term counter 216 and compares the output with $T_L$. When the long-term counter 216 output equals $T_L$ the comparator 218 opens a switch 256 which passes the long-term gain adjustment signal 214 through to a multiplexer 220. The long-term comparator 218 simultaneously resets the long-term counter 216.

The long-term gain calculator 212 generates the long-term gain adjustment signal 214 to maintain the audio input signal 108 within a long-term energy average range. This predetermined range is preferably determined by the dynamic range of the CODEC 110. In the preferred embodiment the upper threshold of the long-term energy average range is 13 significant bits and the lower threshold of the long-term energy average range is 11 significant bits. These preferred values are based upon a preferred embodiment where the CODEC 110 is a 16 bit CODEC. Thus, the output dynamic range of the system 100 is preferably 18 dB. If the long-term energy average output 210 is within the long-term energy average range the long-term gain calculator 212 generates a long-term gain adjustment of zero to effect no gain adjustment. If the long-term energy average output 210 is greater than the upper long-term energy average threshold the long-term gain calculator 212 generates a long-term gain adjustment of less than zero to attenuate the input signal 102. If the long-term energy average output 210 is less than the lower long-term energy average threshold the long-term gain calculator 212 generates a long-term gain adjustment of greater than zero to amplify the input signal 102.

The short-term energy averager 208 is preferably a moving average filter with a relatively short time constant. The short-term energy averager 208 estimates an average of the energy of rectified digital output signal 204 over a relatively small number of samples, corresponding to the filter time constant, and generates a short-term energy average output 242. The following equation describes the preferred embodiment of the calculation of the short-term energy average output 242 by the moving average filter.

$$y(n)=0.125 *\Sigma x(n-i)=y(n-1)+0.125*x(n)-0.125*x(n-8)$$

In the above equation, y(n) is the short-term energy average output 242, x(n) is the rectified digital output signal 204, and n is a sample number. By calculating an average of the energy of the output signal 204 over a relatively small number of samples the short-term energy averager 208 advantageously enables the gain control loop 114 to respond quickly to attenuate, and thus minimize clipping of, the input signal 102.

The short-term energy average output 242 is received by a short-term gain calculator 224. The short-term gain calculator 224 periodically generates a short-term gain adjustment signal 240 according to a short-term gain adjustment period, $T_S$. The time constant of the short-term energy averager 224 is preferably approximately equivalent to the short-term gain adjustment period $T_S$. In the preferred embodiment $T_S$ is approximately eight samples, where the preferred sample rate is 8 kHz. A small value of $T_S$ effects an "emergency" response to quickly avoid clipping. A short-term counter 226 counts up from zero upon being reset. A short-term comparator 228 receives the output of the short-term counter 226 and compares the output with $T_S$. When the short-term counter 226 output equals $T_S$ the comparator 228 opens a switch 254 which passes the short-term gain adjustment signal 240 through to the multiplexer 220. The short-term comparator 228 simultaneously resets the short-term counter 226.

The short-term gain calculator 224 generates the short-term gain adjustment signal 240 to maintain the audio input signal 108 below a short-term energy average threshold. This threshold is preferably determined by the dynamic range of the CODEC 110. In the preferred embodiment the short-term energy average threshold is 15 significant bits, where the CODEC 110 is preferably a 16 bit CODEC. If the short-term energy average output 242 is below the short-term energy average threshold, the short-term gain calculator 224 generates a short-term gain adjustment signal 240 of zero to effect no gain adjustment. If the short-term energy average output 242 is greater than the short-term energy average threshold the short-term gain calculator 224 generates a short-term gain adjustment signal 240 of less than zero to attenuate the input signal 102. Preferably the short-term gain calculator 224 generates a short-term gain adjustment of −3 dB each short-term gain adjustment period, up to 6 periods, as long as the short-term energy average output 242 is greater than the short-term energy average threshold. A long-term gain adjustment period later, the long-term gain calculator 224 responds to adjust the gain to a level within the long-term energy average range.

The multiplexer 220 receives the long-term gain adjustment signal 214 and the short-term gain adjustment signal 240. The select input of the multiplexer 220 is coupled to the short-term gain adjustment signal 240. Hence, the short-term gain adjustment signal 240 is given a higher priority in that, whenever a non-zero short-term gain adjustment signal 240 is generated, the multiplexer 220 selects the short-term gain adjustment signal 240 instead of the long-term gain adjustment signal 214. Thus, the multiplexer 220 advantageously causes the gain control loop 114 to respond to clipping more quickly.

The multiplexer 220 selects either the long-term gain adjustment signal 214 or the short-term gain adjustment signal 240 and outputs a new gain adjustment signal 250.

It is noted that by employing a long-term energy averager and gain calculator in combination with a short-term energy averager and gain calculator, the present invention advantageously achieves the apparently conflicting objectives of having an automatic gain control system which is both stable and responds quickly to clipping.

Combinatorial logic 222 receives the output of the long-term comparator 218 and the output of the short-term comparator 228 and the short-term gain adjustment 240. The combinatorial logic 222 generates the reset input to the long-term counter 216 such that when the short-term gain calculator 224 generates a non-zero short-term gain adjustment 240 the long-term counter 216 is reset. Thus the combinatorial logic 222 preferably avoids generating a long-term gain adjustment immediately following a short-term gain adjustment.

A voice activity detector 230 receives the long-term energy average output 210 and the short-term energy average output 242. The voice activity detector 230 generates a silence present output 236 upon detection of a substantial absence of voice activity. In detecting a substantial absence of voice activity, the voice activity detector 230 detects the ratio of the short-term energy average output 242 and the long-term energy average output 210, and determines if this ratio is less than a silence energy average threshold for a silence time threshold. The silence energy average threshold is preferably approximately 30 dB. The silence time threshold is preferably approximately 400 samples at a preferred sample rate of 8 kHz. The value of the silence energy average threshold is chosen as a function of the operating signal to noise ratio of the system 100. The silence energy average threshold is preferably chosen to be a few dB below the signal to noise ratio so that low energy speech on the audio input signal 102 is not mistaken as noise, i.e., as silence.

The long-term energy averager 206 receives the silence present output 236. The long-term energy averager 206 advantageously pauses operation during the absence of voice activity. That is, the long-term energy averager 206 does not include samples of the rectified output signal 204 in calculating the long-term energy average output 210 in the absence of voice activity. Thus, advantageously the voice activity detector causes the long-term energy averager 206 to more accurately estimate the average energy of the rectified output signal 204 since the silence does not affect the long-term energy average. If the long-term energy average output 210 included the silence, the long-term energy average output 210 would be inordinately small, thus the long-term gain calculator 212 would greatly increase the gain of the amplifier 104. This would potentially cause instability in the system 100. Thus, advantageously the voice activity detector increases the stability of the system 100. A more accurate long-term energy average output also causes the voice activity detector to advantageously more accurately detect the presence of silence.

The analog amplifier 104 has a limited gain range. In the preferred embodiment the upper limit of the gain range is 30 dB and the lower limit is −30 dB. The gain adjustment 250 is received by a gain limiter 232. The gain limiter 232 insures that the gain control loop 114 adjusts the amplifier gain only within the limited gain range of the amplifier 104. The gain limiter 232 maintains the old digital gain output, i.e., the previous value of the digital gain output 116. Each time a new gain adjustment 250 is generated, the gain limiter 232 adds the new gain adjustment 250 to the old digital gain output to produce a new gain level. The gain limiter 232 then compares the new gain level with the upper and lower limits of the gain range. If the new gain level is greater than the upper limit of the gain range the gain limiter 232 makes the new gain level to be the upper limit of the gain range and makes the gain-limited new gain adjustment 248 to be the upper limit of the gain range minus the old digital gain output. If the new gain level is less than the lower limit of the gain range the gain limiter 232 makes the new gain level to be the lower limit of the gain range and makes the gain-limited new gain adjustment 248 to be the lower limit of the gain range minus the old digital gain output. It is noted that the gain-limited new gain adjustment is a signed value. The gain limiter 232 then makes the old digital gain output to be the new gain level. The gain limiter 232 then outputs the gain-limited new gain adjustment 248.

The following pseudo-code illustrates the operation of the gain limiter.

```
new gain level =
    old digital gain output + new gain adjustment
if (new gain level > upper limit) {
    new gain level = upper limit
    gain limited new gain adjustment =
        upper limit - old digital gain output
} else if (new gain level < lower limit) {
    new gain level = lower limit
    gain limited new gain adjustment =
        lower limit - old digital gain output
}
old digital gain output = new gain level
output gain limited new gain adjustment
```

A zero crossing detector 252 receives the digital audio output signal 112. The zero crossing detector examines samples of the output signal 112 and generates a zero crossing output 244 upon detection of a zero crossing of the output signal 112. A zero crossing is defined as the product of two consecutive samples of the output signal 112 being less than or equal to zero.

A gain adjustment scheduler 234 receives the gain-limited new gain adjustment 248 and the zero crossing output 244. The gain adjustment scheduler 234 adjusts the amplifier gain to minimize the amount of distortion introduced by the system 100 into the output signal 112. The gain adjustment scheduler 234 advantageously accomplishes this purpose by adjusting the amplifier 104 gain near zero crossings and in incremental steps to avoid causing perceivable large distortion or clipping.

The gain adjustment scheduler 234 preferably calculates a number of gain adjustment steps by dividing the gain-limited new gain adjustment 248 by a gain step. Then, for each gain adjustment step the gain adjustment scheduler 234 preferably waits a gain adjustment interval and outputs the digital gain output 116 to adjust the amplifier 104 gain one gain step on the occurrence of a zero crossing. It is noted that the number of gain adjustment steps is a signed value since the gain-limited new gain adjustment 248 is also a signed value. The gain adjustment scheduler 234 maintains the old digital gain output which it uses to calculate the digital gain output 116. The following pseudo-code illustrates the operation of the gain adjustment scheduler 234.

```
gain adjustment steps =
    gain limited new gain adjustment/gain step
while (gain adjustment steps != 0) {
    if (gain adjustment steps > 0)
        gain adjustment steps =
            gain adjustment steps - 1
    else if (gain adjustment steps < 0)
        gain adjustment steps =
            gain adjustment steps + 1
    digital gain output =
        old gain output * gain step
    old gain output = digital gain output
    wait one gain adjustment interval
    wait for zero crossing
    generate digital gain output
}
```

In the preferred embodiment of the present invention the gain step is approximately 1.5 dB and the gain adjustment interval is approximately 40 samples at a preferred sample rate of 8 kHz. By preferably waiting a gain adjustment interval to adjust the amplifier 104 gain, the gain adjustment scheduler 234 avoids adjusting the gain too frequently in the case where the output signal 112 frequency is high thus generating many zero crossings.

The voice activity detector 230 additionally generates a voice present output 238 upon detection of the presence of voice activity. The presence of voice activity is defined as the ratio of the short-term energy average output 242 and the long-term energy average output 210 being greater than a voice energy average threshold for a voice time threshold. The voice energy average threshold is preferably approximately 12 dB. The voice time threshold is preferably approximately 400 samples at a preferred sample rate of 8 kHz. The voice time threshold is preferably a relatively small value in order to avoid "cut-out" of the first portion, e.g., syllable, of a voice sequence.

The gain adjustment scheduler 234 receives the voice present output 238. The gain adjustment scheduler only increases the gain of the amplifier 104 in the presence of voice activity. Hence, the voice activity detector advantageously enables the system 100 to suppress noise amplification during periods of silence.

Numerous variations and modifications will become apparent to those skilled in the art once the above disclosure is fully appreciated. It is intended that the following claims be interpreted to embrace all such variations and modifications.

What is claimed is:

1. A system which performs automatic gain control on received audio data, comprising:

an analog amplifier with an adjustable gain which receives an analog audio input signal and an analog gain input and generates an analog audio output signal, wherein said amplifier selectively adjusts the gain of said analog audio output signal according to said analog gain input; and a codec which receives said analog audio output signal and converts said analog audio output signal to a digital audio output signal;

a digital-to-analog converter having an input and an output, wherein said output is coupled to said analog gain input; and a gain control loop coupled to said input of said digital-to-analog converter which receives said digital audio output signal, wherein said gain control loop generates a digital gain output signal provided to said digital-to-analog converter input, wherein said digital-to-analog converter converts said digital gain output signal to an analog gain output signal provided to said analog gain input to selectively adjust said gain of said amplifier, wherein said control loop comprises a digital signal processor, wherein said gain control loop is configured to periodically calculate a long-term energy average according to a long-term gain adjustment period, and wherein said gain control loop is configured to periodically calculate a short-term energy average according to a short-term gain adjustment period, wherein said long-term energy average is utilized to generate said digital gain output signal upon said periodic calculation of said long-term energy average, and wherein said short-term energy average is utilized to generate said digital gain output signal upon said periodic calculation of said short-term energy average;

a voice activity detector coupled to receive said long-term energy average and said short-term energy average in order to detect a substantial absence of voice activity on said audio input signal, wherein said voice activity detector inhibits adjusting said audio input signal during said substantial absence of voice activity.

2. The system of claim 1, wherein said control loop comprises:

a long-term energy averager which receives said digital audio output signal and calculates said long-term energy average of said digital audio output signal based on a first number of samples of said digital audio output signal, wherein said long-term energy averager generates a long-term energy average output in response to said calculated long-term energy average;

a long-term gain adjustment calculator which receives said long-term energy average output, wherein said long-term gain adjustment calculator is configured to periodically generate a long-term gain adjustment signal according to said long-term gain adjustment period, wherein said long-term gain adjustment calculator generates said long-term gain adjustment signal to attenuate said analog audio input signal when said long-term energy average output is greater than an upper long-term energy average threshold, and wherein said long-term gain adjustment calculator generates said long-term gain adjustment signal to amplify said analog audio input signal when said long-term energy average output is less than a lower long-term energy average threshold;

a short-term energy averager which receives said digital audio output signal and calculates said short-term energy average of said digital audio output signal based on a second number of samples of said digital audio output signal, wherein said short-term energy averager generates a short-term energy average output in response to said calculated short-term energy average, wherein said second number is less than said first number; and a short-term gain adjustment calculator which receives said short-term energy average output, wherein said short-term gain adjustment calculator is configured to periodically generate a short-term gain adjustment signal according to said short-term gain adjustment period to attenuate said audio input signal when said short-term energy average output is greater than a short-term energy average threshold.

3. The system of claim 2, wherein said codec has a characteristic dynamic range, wherein said upper long-term energy average threshold, said lower long-term energy average threshold and said short-term energy average threshold are a function of said dynamic range of said codec.

4. The system of claim 2, wherein said gain control loop selectively generates said digital gain output signal, wherein said gain control loop selects said long-term gain adjustment signal to use in generating said digital gain output signal when said long-term gain adjustment calculator generates said long-term gain adjustment signal, wherein said gain control loop selects said short-term gain adjustment signal to use in generating said digital gain output signal when said short-term gain adjustment calculator generates said short-term gain adjustment signal.

5. The system of claim 4, wherein said control loop uses said short-term gain adjustment signal with a higher priority than said long-term gain adjustment signal when said long-term gain adjustment calculator and said short-term gain adjustment calculator simultaneously generate said long-term gain adjustment signal and said short-term gain adjustment signal, respectively.

6. The system of claim 2, wherein said voice activity detector determines if the ratio of said short-term energy average output and said long-term energy average output is less than a silence energy average threshold for a silence time threshold, in order to detect said substantial absence of voice activity.

7. The system of claim 2, wherein said voice activity detector determines if the ratio of said short-term energy average output and said long-term energy average output is more than a voice energy average threshold for a voice time threshold, in order to detect said substantial voice activity.

8. The system of claim 2, wherein said amplifier has an associated gain range; and
wherein said control loop further comprises:
a gain limiter which receives a selected one of said long-term gain adjustment signal and said short-term gain adjustment signal and generates said digital gain output signal within said gain range.

9. The system of claim 2, wherein when said short-term gain adjustment calculator generates a non-zero short-term gain adjustment signal said long-term gain adjustment period is restarted.

10. The system of claim 2, wherein said first number of samples is between one and five orders of magnitude larger than said second number of samples.

11. The system of claim 2, wherein said long-term energy averager is a normalized auto-regressive filter having a characteristic time constant, wherein said long-term energy averager filter time constant is approximately equivalent to said long-term gain adjustment period.

12. The system of claim 2, wherein said short-term energy averager is a moving-average filter having a characteristic time constant, wherein said short-term energy averager filter time constant is approximately equivalent to said short-term gain adjustment period.

13. The system of claim 2, wherein said control loop further comprises:
a rectifier which receives said digital audio output signal and rectifies said digital audio output signal, wherein said long-term energy averager receives said rectified digital audio output signal for calculating said long-term energy average, wherein said short-term energy averager receives said rectified digital audio output signal for calculating said short-term energy average.

14. The system of claim 1, wherein said gain adjustment scheduler generates a gain adjustment signal, wherein said control loop further comprises:

a zero-crossing detector which receives said digital audio output signal and generates a zero crossing output upon detection of a zero crossing, wherein said zero crossing occurs when a product of two consecutive samples of said digital audio output signal being less than or equal to zero; and a gain adjustment scheduler which receives said zero crossing output and said gain adjustment signal, wherein said gain adjustment scheduler maintains a previous digital gain output signal value, wherein said gain adjustment scheduler calculates a number of gain adjustment steps by dividing said gain adjustment signal by a gain step, wherein for each of said number of gain adjustment steps said gain adjustment scheduler waits a gain adjustment interval then generates said digital gain output signal when said zero crossing output indicates an occurrence of said zero crossing, wherein said digital gain output signal has a value which is one said gain step different than said previous digital gain output signal value.

15. A method for performing automatic gain control on a received analog audio input signal, comprising:
receiving an analog gain input signal;
amplifying said analog audio input signal to generate an analog audio output signal according to said analog gain input signal;
converting said analog audio output signal to a digital audio output signal;
generating a digital gain output signal, wherein said generating includes periodically computing a long-term energy average according to a long-term gain adjustment period, and wherein said generating includes periodically computing a short-term energy average according to a short-term gain adjustment period, wherein said digital gain output signal is adjusted according to said long-term energy average upon each calculation of said long-term energy average, and wherein said digital gain output signal is adjusted according to said short-term energy average upon each calculation of said short-term energy average;
detecting a substantial absence of voice activity on said digital audio output signal by utilizing said long-term energy average and said short-term energy average;
inhibiting said amplifying said analog audio input signal in response to said detecting said substantial absence of voice activity;
converting said digital gain output signal to an analog gain output signal for providing to said analog gain input signal.

16. The method of claim 15, further comprising:
calculating said long-term energy average of said digital audio output signal based on a first number of samples of said digital audio output signal;
periodically generating a long-term gain adjustment signal based on said long-term energy average according to said long-term gain adjustment period to attenuate said audio input signal when said long-term energy average is greater than an upper long-term energy average threshold and to amplify said audio input signal when said long-term energy average is less than a lower long-term energy average threshold;
calculating said short-term energy average of said audio output signal based on a second number of samples of said audio output signal;
periodically generating a short-term gain adjustment signal based on said short-term energy average according to said short-term gain adjustment period to attenuate said audio input signal when said short-term energy average is greater than a short-term energy average threshold.

17. The method of claim 15, further comprising:

selecting said long-term gain adjustment signal to use in generating an analog gain output signal during a first time period;

selecting said short-term gain adjustment signal to use in generating said analog gain output signal during a second time period;

providing said gain output signal to said analog gain input signal.

18. The method of claim 15 wherein said amplifying said analog audio input signal is within a limited gain range.

19. The method of claim 15 further comprising:

detecting a zero crossing of said digital audio output signal;

calculating a number of gain adjustment steps by dividing a gain adjustment signal by a gain step;

for each of said number of gain adjustment steps waiting a gain adjustment interval, generating an analog gain output signal, and providing said analog gain output signal to said analog gain input signal.

* * * * *